(12) United States Patent
Sinha

(10) Patent No.: US 9,099,431 B2
(45) Date of Patent: Aug. 4, 2015

(54) POLISHING SYSTEMS AND METHODS FOR REMOVING CONDUCTIVE MATERIAL FROM MICROELECTRONIC SUBSTRATES

(71) Applicant: Micron Technology, Inc., Boise, ID (US)

(72) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/323,945

(22) Filed: Jul. 3, 2014

(65) Prior Publication Data

US 2014/0322890 A1  Oct. 30, 2014

Related U.S. Application Data

(62) Division of application No. 12/185,675, filed on Aug. 4, 2008, now Pat. No. 8,772,939.

(51) Int. Cl.
*H01L 23/532* (2006.01)
*H01L 49/02* (2006.01)
*H01L 21/321* (2006.01)
*H01L 21/768* (2006.01)

(52) U.S. Cl.
CPC ............ *H01L 28/40* (2013.01); *H01L 21/3212* (2013.01); *H01L 21/32125* (2013.01); *H01L 21/7684* (2013.01); *H01L 21/76882* (2013.01); *H01L 28/90* (2013.01); *H01L 2924/0002* (2013.01)

(58) Field of Classification Search
CPC .................... H01L 21/76898; H01L 21/76877
USPC ............ 257/770, E23.01, E21.476; 438/685, 438/107
See application file for complete search history.

(56) References Cited

U.S. PATENT DOCUMENTS

| | | | |
|---|---|---|---|
| 5,468,684 | A | 11/1995 | Yoshimori et al. |
| 6,103,586 | A | 8/2000 | Chetlur et al. |
| 6,225,227 | B1 | 5/2001 | Aizawa |
| 6,265,740 | B1 | 7/2001 | Kim |
| 2002/0008270 | A1 | 1/2002 | Marsh |

(Continued)

FOREIGN PATENT DOCUMENTS

| | | |
|---|---|---|
| CN | 1636262 | 7/2005 |
| WO | 02084718 | 10/2002 |

OTHER PUBLICATIONS

International Search Report and Written Opinion issued Sep. 10, 2009 for International Application No. PCT/US2009/050146.
Office Action issued Feb. 28, 2012 in Korea Application No. 10-2011-7005087, 5 pages.

(Continued)

*Primary Examiner* — Andy Huynh
*Assistant Examiner* — Sitaramarao S Yechuri
(74) *Attorney, Agent, or Firm* — Perkins Coie LLP

(57) ABSTRACT

Polishing systems and methods for removing conductive material (e.g., noble metals) from microelectronic substrates are disclosed herein. Several embodiments of the methods include forming an aperture in a substrate material, disposing a conductive material on the substrate material and in the aperture, and disposing a fill material on the conductive material. The fill material at least partially fills the aperture. The substrate material is then polished to remove at least a portion of the conductive material and the fill material external to the aperture during which the fill material substantially prevents the conductive material from smearing into the aperture during polishing the substrate material.

15 Claims, 9 Drawing Sheets

(56) References Cited

U.S. PATENT DOCUMENTS

2004/0043629 A1   3/2004  Lee et al.
2006/0170025 A1*  8/2006  Drynan ........................ 257/306
2010/0025854 A1   2/2010  Sinha

OTHER PUBLICATIONS

Office Action issued Nov. 5, 2012 in China Application No. 2009801298049, 22 pages.
Office Action issued Nov. 7, 2012 in Taiwan Application No. 098124605, 19 pages.

* cited by examiner

POLISHING SYSTEMS AND METHODS FOR REMOVING CONDUCTIVE MATERIAL FROM MICROELECTRONIC SUBSTRATES

CROSS REFERENCE TO RELATED APPLICATION

This application is a divisional of U.S. application Ser. No. 12/185,675 filed Aug. 4, 2008, now U.S. Pat. No. 8,772,939, which is incorporated herein by reference.

TECHNICAL FIELD

The present disclosure is directed to polishing systems and methods for removing conductive material (e.g., platinum and/or platinum alloys) from microelectronic substrates.

BACKGROUND

Microelectronic devices typically include capacitors, transistors, and/or other electrical features formed in isolated containers in microelectronic substrates. One technique for forming such containers includes blanketing semiconductor substrates having apertures with a conductive material (e.g., platinum), and then overfilling the apertures with a generally nonconductive material (e.g., a photoresist or silicon oxide). The excess conductive and nonconductive materials external to the apertures are then removed using chemical-mechanical polishing (CMP). The remaining nonconductive material in the apertures is then removed to form individual containers having a conformal layer of the conductive material on the sidewalls of the apertures.

One drawback with the foregoing technique is that during the CMP process a portion of the conductive material may become embedded in the nonconductive material within the apertures. In one example, the nonconductive material can adsorb small particles of the conductive material removed from the conductive layer during CMP. In another example, mechanical forces of the CMP process can smear the conductive material into the nonconductive material in the apertures. The embedded conductive material can cause short circuits and/or other defects in the electrical features subsequently formed in the containers. Accordingly, there is a need for polishing systems and methods with improved effectiveness in removing conductive material from microelectronic substrates.

DETAILED DESCRIPTION

Specific details of several embodiments of the disclosure are described below with reference to polishing systems and methods for removing conductive material from microelectronic substrates. The term "microelectronic substrate" is used throughout to include substrates upon which and/or in which microelectronic devices, micromechanical devices, data storage elements, read/write components, and other features are fabricated. A person skilled in the relevant art will also understand that the disclosure may have additional embodiments, and that the disclosure may be practiced without several of the details of the embodiments described below with reference to FIGS. 2A-5.

FIGS. 1A-E, are partial cross-sectional views of a microelectronic substrate 110 illustrating several stages of a process for forming electrical features in accordance with an embodiment of the disclosure. As described in more detailed below, several embodiments of the process can include removing a conductive material (e.g., platinum or platinum alloys) from the microelectronic substrate 110 with reduced conductive material smearing than conventional techniques. In the illustrated embodiment, the described process includes a particular sequence of processing stages. In other embodiments, the process can also include different and/or additional processing stages.

Figure 1A:
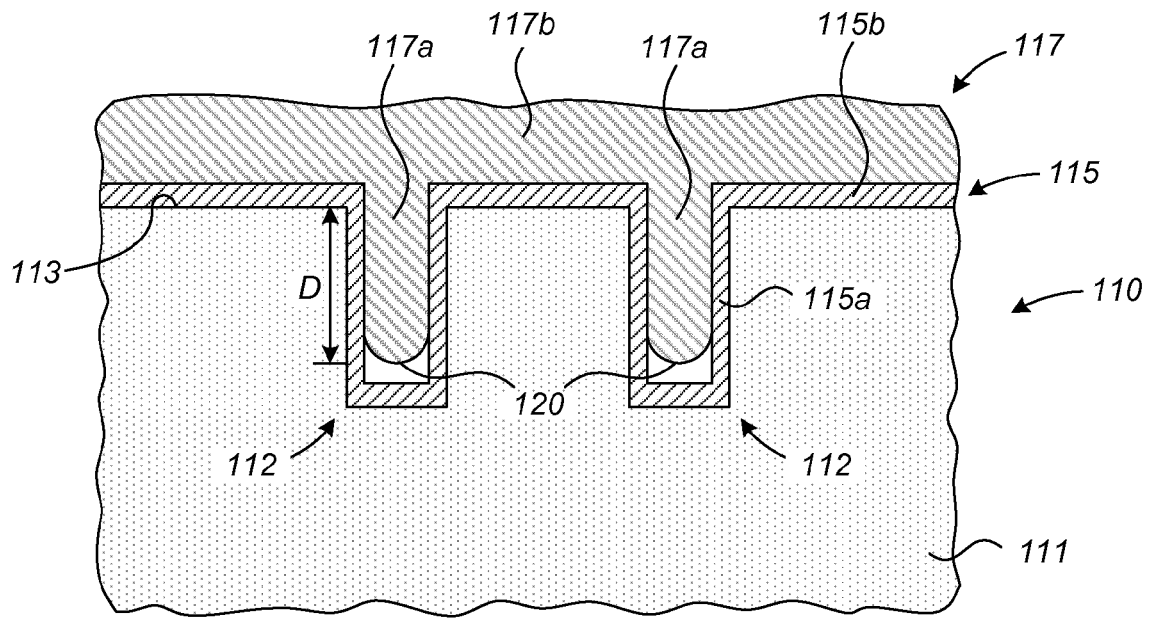
FIGS. 1A-E are partial cross-sectional views illustrating a process for forming electrical features in a microelectronic substrate in accordance with an embodiment of the disclosure.

As shown in FIG. 1A, the microelectronic substrate 110 includes one or more apertures 112 (two are shown in FIG. 1A for illustration purposes) formed in a substrate material plane 113 of a substrate material 111. The substrate material 111 can include borophosphosilicate glass (BPSG), undoped silicon dioxide, and/or other suitable substrate material 111. The apertures 112 can have an aspect ratio (i.e., depth-to-width ratio) of about 4:1, 6:1, 10:1, and/or other desired aspect ratio. Optionally, the microelectronic substrate 110 can include a barrier layer (not shown) on the substrate material plane 113 and adjacent to the walls of the apertures 112.

As illustrated in FIG. 1A, an early stage of the process includes depositing a layer of conductive material 115 on the substrate material 111. The conductive material 115 can include a first portion 115a in the apertures 112 and a second portion 115b external to the apertures 112. The conductive material 115 can be deposited on the microelectronic substrate 110 using physical vapor deposition (PVD), chemical vapor deposition (CVD), and/or other suitable deposition techniques. In a particular embodiment, the conductive material 115 includes platinum or platinum alloys. In other embodiments, the conductive material 115 can include gold, silver, tantalum, palladium, and rhodium, other suitable noble metal, and/or alloys thereof in further embodiments, the conductive material 115 can include nickel, iridium, and/or other suitable Group VIII material and/or their alloys.

FIG. 1A illustrates another stage of the process that includes depositing a fill material 117 on the conductive material 115. The fill material 117 can include a first portion 117a that is beneath the substrate material plane 113 and in the apertures 112. The fill material 117 can also include a second portion 117b that is external to the apertures 112 and extends outwardly away from the substrate material plane 113. The second portion 117b can have a thickness of about 100 angstroms to about 250 angstroms and/or other suitable thickness. In the illustrated embodiment, the first portion 117a includes a tapered end 120 and extends into the corresponding apertures 112 from the substrate material plane 113 for a distance D (e.g., at least about 1000 Angstroms) without completely filling the apertures 112. In other embodiments, the first portion 117a can substantially completely fill the apertures 112. In further embodiments, the first portion 117a can be substantially flush with the substrate material plane 113. In any of these embodiments, the first portion 117a can fill at least a portion of the apertures 112.

The fill material 117 can have a hardness greater than that of the conductive material 115. For example, in a particular embodiment, the conductive material 115 includes platinum, and the fill material 117 includes titanium nitride (TiN) deposited onto the conductive material 115 using low-temperature CVD. In other embodiments, the fill material 117 can include titanium (Ti) deposited onto the conductive material 115 via PVD, spin-on titanium oxide (TiO$_x$), tungsten (W), nickel (Ni), molybdenum (Mo), cobalt (Co), and/or other material with a hardness of at least about 30 GPa. In any of these embodiments, the relatively hard fill material 117 can resist penetration from the conductive material 115 during subsequent polishing stages as described in greater detail below.

Figure 1B:
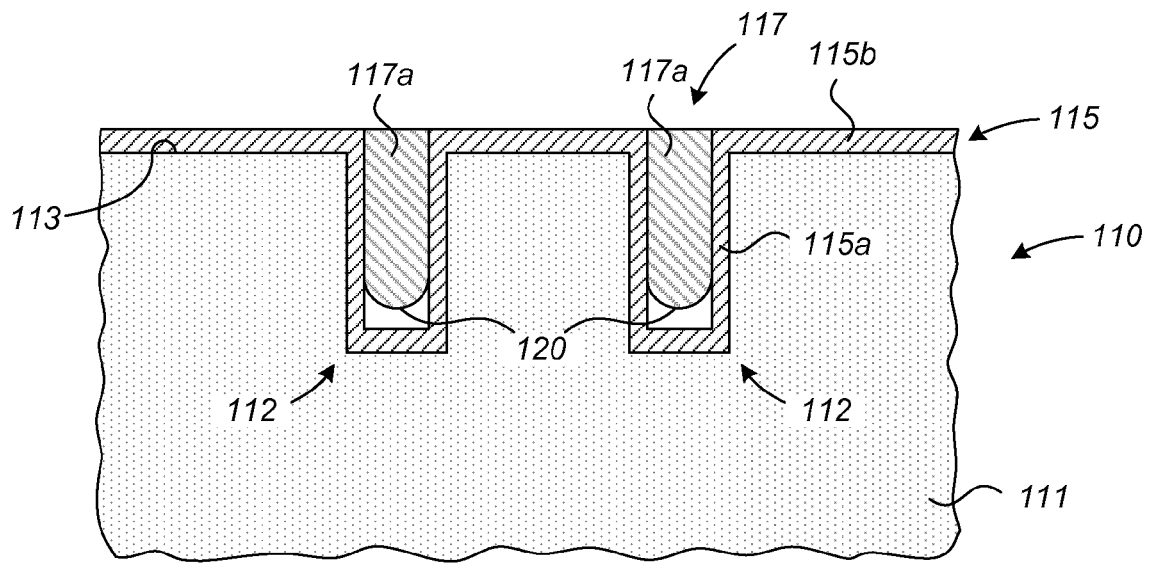

FIG. 1B illustrates another stage of the process that includes removing the second portion 117b of the fill material 117 from the microelectronic substrate 110. In the illustrated embodiment, the remaining fill material 117 is generally flush with the conductive material 115. In other embodiments, the remaining fill material 117 can extend beyond the conductive material 115. In further embodiments, the remaining fill material 117 can be recessed into the apertures 112 from the conductive material 115. In any of these embodiments, conventional CMP techniques and slurries can be used to remove the second portion 117h of the fill material. Examples of polishing apparatus for removing the second portion 117b are described in greater detail below with reference to FIGS. 2-5.

Figure 1C:
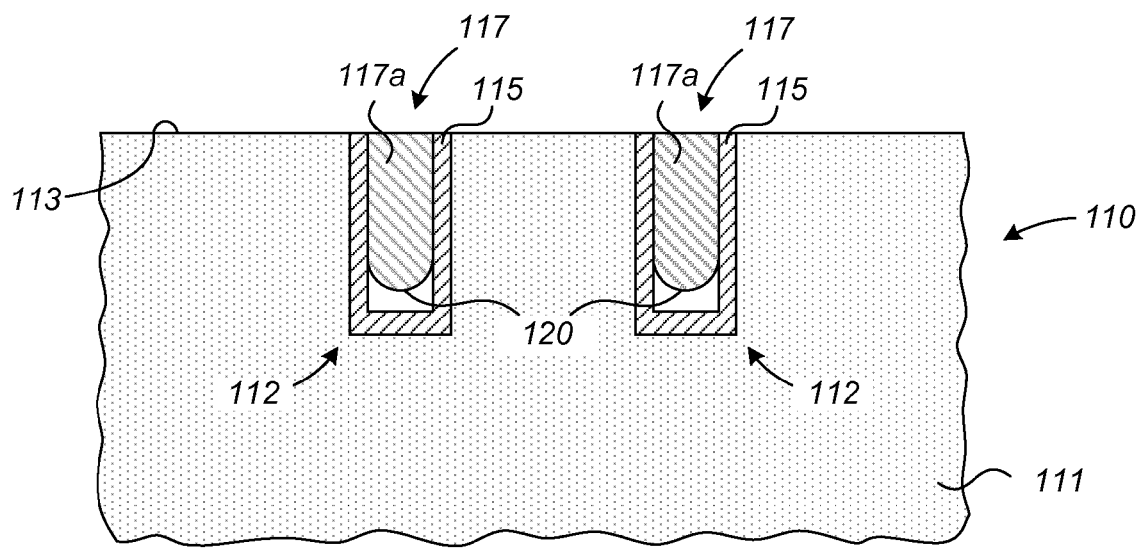

FIG. 1C illustrates a subsequent stage of the process that includes removing portions of the conductive material 115 and the fill material 117 above the substrate plane 113 and external to the apertures 112. The conductive material 115 and the fill material 117 can be removed using CMP, electro-chemical-mechanical polishing (ECMP), and/or other suitable techniques. For example, in one embodiment, the conductive material 115 and the fill material 117 can be removed using the same CMP process and slurries as in the stage of FIG. 1B. In other embodiments, the conductive material 115 and the fill material 117 can be removed using different CMP processes and/or suitable slurries. In these embodiments, the removal of the conductive material 115 and the fill material 117 can be halted upon exposing the substrate material plane 113.

Figure 1D:
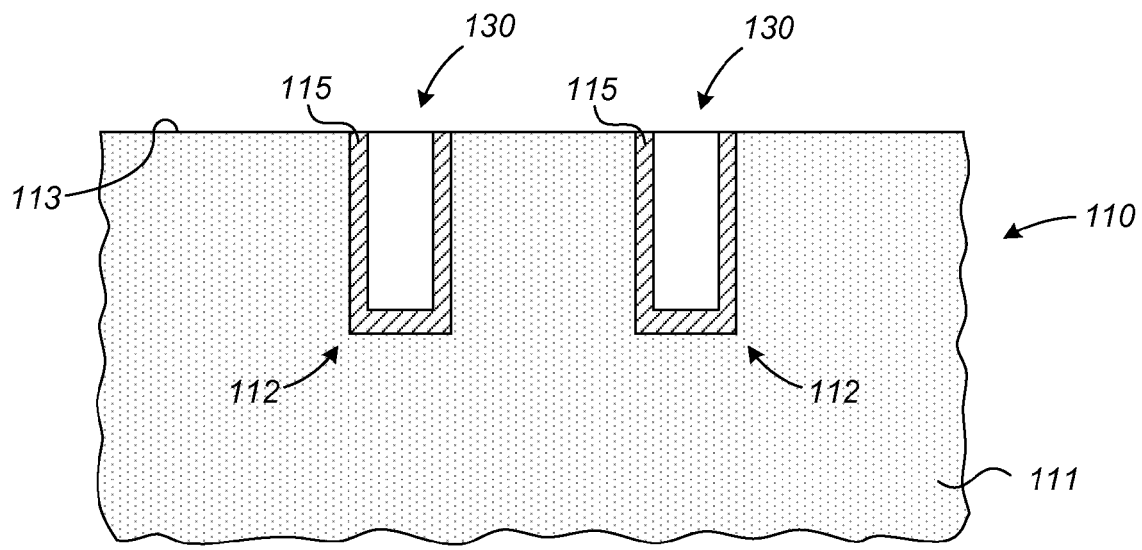

FIG. 1D illustrates a subsequent stage of the process that includes removing the remaining portion of the fill material 117 from the apertures 112 to form containers 130. In one embodiment, removing the fill material 117 can include using a wet etch procedure to remove the fill material 117. For example, the microelectronic substrate 110 can be treated with an etchant that contains hydrogen peroxide ($H_2O_2$), ammonium hydroxide ($NH_4OH$), and/or other suitable chemicals to remove the fill material containing titanium nitride, in other embodiments, the fill material containing titanium and/or titanium oxide can be removed using dry etch (e.g., reactive ion etch), laser ablation, and/or other suitable techniques.

Figure 1E:
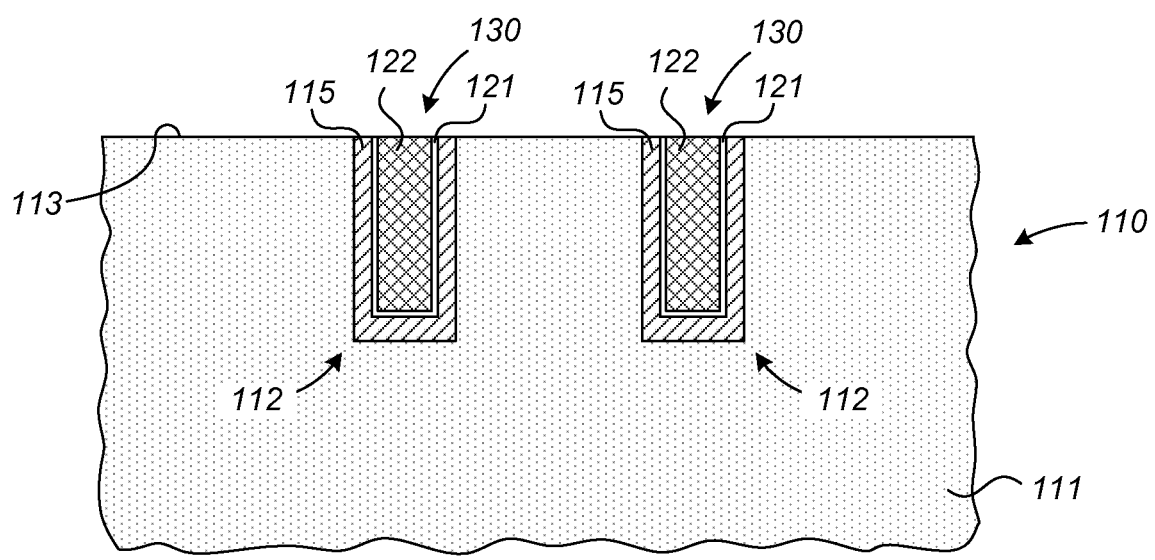

FIG. 1E illustrates a further stage of the process that includes forming electrical features (such as electrodes, capacitors, etc.) in the containers 130. The electrical features can be formed using selective etch and deposition and/or other suitable techniques. The electrical features can be electrically coupled to one another and/or to external contacts with a network of vias and/or lines (not shown) formed with damascene techniques and/or other suitable techniques. For example, in one embodiment, a layer of nonconductive material 121 (e.g., silicon oxide, tantalum pentoxide, etc.) is disposed in the apertures 112 before conductive electrodes 122 are disposed to form capacitors. In other embodiments, the foregoing techniques can be used to form transistors, trenches, conductive lines, and/or other electrical features in the microelectronic substrate 110. In any of these embodiments, portions of the microelectronic substrate 110 can then be diced from a larger wafer and incorporated into various electronic devices.

Several embodiments of the process described above with reference to FIGS. 1A-E can reduce or eliminate embedding the conductive material 115 in the fill material 117 during polishing. According to conventional techniques, a photoresist is typically used as the fill material 117 to prevent abrasives and/or other particles from entering the containers 130. However, the inventors have discovered that the photoresist cannot prevent smearing the conductive material 115 containing, e.g., platinum and/or platinum alloys, into the containers 130 during polishing even with low polishing forces (e.g., about 0.3 PSI) or with ECMP. Without being bound by theory, it is believed that the malleability of platinum and/or platinum alloys at least partially causes such a smearing effect. The inventors have also recognized that the smearing of platinum and/or platinum alloys can be at least reduced if not eliminated if the fill material 117 can at least restrict the movement of the conductive material 115 during polishing to enable applying sufficient polishing forces for its removal. Without being bound by theory, it is believed that the hardness and/or other physical characteristics of the fill material 117 containing titanium nitride (TiN), titanium (Ti), titanium oxide (TiO$_x$), tungsten (W), nickel (Ni), molybdenum (Mo), cobalt (Co), and/or other material with a hardness of at least about 30 GPa can generate an internal strain that compresses and restricts the underlying conductive material 115 during polishing. Such compression is believed to prevent the conductive material 115 from spreading into the containers 130 when a polishing force is applied.

Several embodiments of the process described above with reference to FIGS. 1A-E can also reduce the manufacturing cost for forming the containers 130. According to conventional techniques, after removing the photoresist external to the apertures 112 using a CMP process, the conductive material 115 external to the apertures 112 is removed using a dry etch procedure. After the dry etch procedure, conventional techniques further include removing the photoresist from the apertures 112 using, e.g., a wet etch procedure. Accordingly, several embodiments of the process described above can reduce the manufacturing cost by eliminating the dry etch procedure and instead remove both the conductive material 115 and the fill material 117 external to the apertures 112 with a single CMP and/or an ECMP procedure.

The process described above with reference to FIGS. 1A-F can have additional and/or different process stages. For example, removing the second portion 117b of the fill material 117 (as illustrated in FIG. 1B) and removing portions of the conductive material 115 and the fill material 117 external to the apertures 112 (as illustrated in FIG. 1C) can be performed in one processing stage using a CMP or an ECMP procedure. In other embodiments, the process can further include depositing barrier layers (not shown), e.g., between the conductive material 115 and the substrate material 111. Even though the first portion 117a of the fill material 117 is illustrated in FIGS. 1A-C to have the tapered end 120, in further embodiments, the first portion 117a can have other suitable shapes and dimensions.

Figure 2:
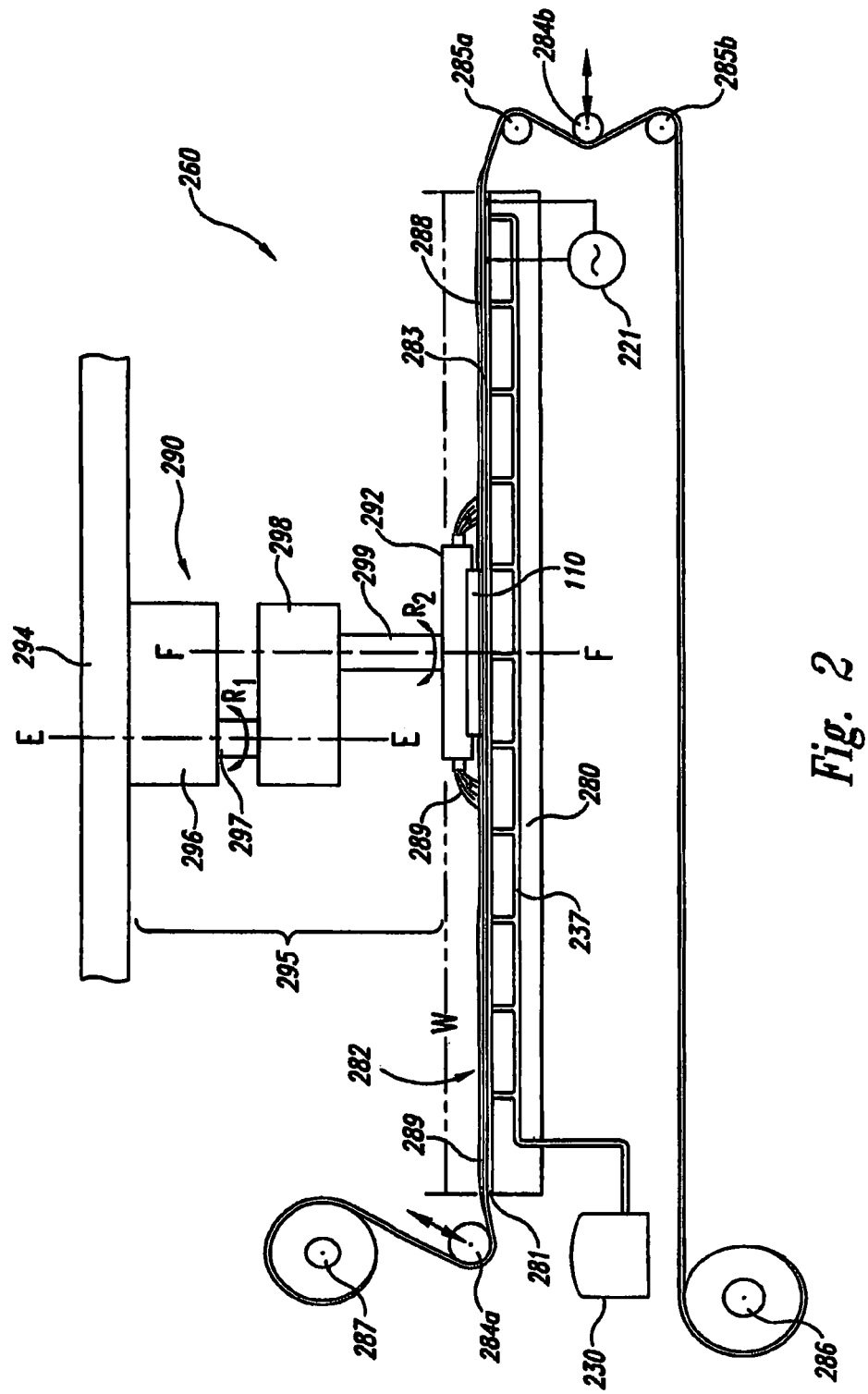
FIG. 2 is a side view of a polishing system for carrying out processes in accordance with embodiments of the disclosure in which selected components are shown schematically.

FIGS. 2-5 schematically illustrate examples of polishing apparatus for processing the microelectronic substrate 110 in a manner generally similar to that described above with reference to FIGS. 1A-E. For example, FIG. 2 schematically illustrates a polishing apparatus 260 configured to chemically-mechanically and/or electrochemically-mechanically polish the microelectronic substrate 110 in accordance with an embodiment of the invention. As illustrated in FIG. 2, the polishing apparatus 260 includes a support table 280 with a top-panel 281 upon which a polishing pad 283 is positioned. The top-panel 281 can include a generally rigid plate to provide a flat, solid surface to which a particular section of the polishing pad 283 may be secured during polishing.

The polishing apparatus 260 can also include a plurality of rollers to guide, position, and hold the polishing pad 283 over the top-panel 281. The rollers can include a supply roller 287, first and second idler rollers 284a and 284b, first and second guide rollers 285a and 285b, and a take-up roller 286. The supply roller 287 carries an unused or preoperative portion of the polishing pad 283, and the take-up roller 286 carries a used or postoperative portion of the polishing pad 283. Additionally, the first idler roller 284a and the first guide roller 285a can stretch the polishing pad 283 over the top-panel 281 to hold the polishing pad 283 stationary during operation. A motor (not shown) drives at least one of the supply roller 287 and the take-up roller 286 to sequentially advance the polishing pad 283 across the top-panel 281. Accordingly, clean preoperative sections of the polishing pad 283 may be quickly substituted for used sections to provide a consistent surface for polishing and/or cleaning the microelectronic substrate 110.

The polishing apparatus 260 can also have a carrier assembly 290 that controls and protects the microelectronic substrate 110 during polishing. The carrier assembly 290 can include a substrate holder 292 to pick up, hold, and release the substrate 110 at appropriate stages of the polishing process. The carrier assembly 290 can also have a support gantry 294 carrying a drive assembly 295 that can translate along the gantry 294. The drive assembly 295 can have an actuator 296, a drive shaft 297 coupled to the actuator 296, and an arm 298 projecting from the drive shaft 297. The arm 298 carries the substrate holder 292 via a terminal shaft 299 such that the drive assembly 295 orbits the substrate holder 292 about an axis E-E (as indicated by arrow "$R_1$"). The terminal shaft 299 may also rotate the substrate holder 292 about its central axis F-F (as indicated by arrow "$R_2$").

The polishing pad 283 and a polishing liquid 289 define a polishing medium 282 that mechanically, chemically-mechanically, and/or electrochemical-mechanically removes material from the surface of the microelectronic substrate 110. In some applications, the polishing pad 283 used in the polishing apparatus 260 can be a fixed-abrasive polishing pad with abrasive particles fixedly bonded to a suspension medium. Accordingly, the polishing liquid 289 can be a "clean solution" without abrasive particles because the abrasive particles are fixedly distributed across a polishing surface 288 of the polishing pad 283. In other applications, the polishing pad 283 may be a nonabrasive pad without abrasive particles, and the polishing liquid 289 can be a slurry with abrasive particles and chemicals to remove material from the microelectronic substrate 110.

To polish the microelectronic substrate 110 with the polishing apparatus 260, the carrier assembly 290 presses the microelectronic substrate 110 against the polishing surface 288 of the polishing pad 283 in the presence of the polishing liquid 289. The drive assembly 295 then orbits the substrate holder 292 about the axis F-F and optionally rotates the substrate holder 292 about the axis F-F to translate the microelectronic substrate 110 across the polishing surface 288. As a result, the abrasive particles and/or the chemicals in the polishing medium 282 remove material from the surface of the microelectronic substrate 110 in a chemical and/or chemical-mechanical polishing process.

In further applications, the polishing liquid 289 can also include an electrolyte for ECMP processing. For example, the polishing apparatus 260 can include an electrolyte supply vessel 230 that delivers an electrolyte separately to the polishing surface 288 of the polishing pad 283 with a conduit 237 as described in greater detail below with reference to FIG. 3. The polishing apparatus 260 can further include a current supply 221 coupled to electrodes positioned proximate to the polishing pad 283. Accordingly, the polishing apparatus 260 can remove material from the microelectronic substrate 110 via electrolysis.

Figure 3:
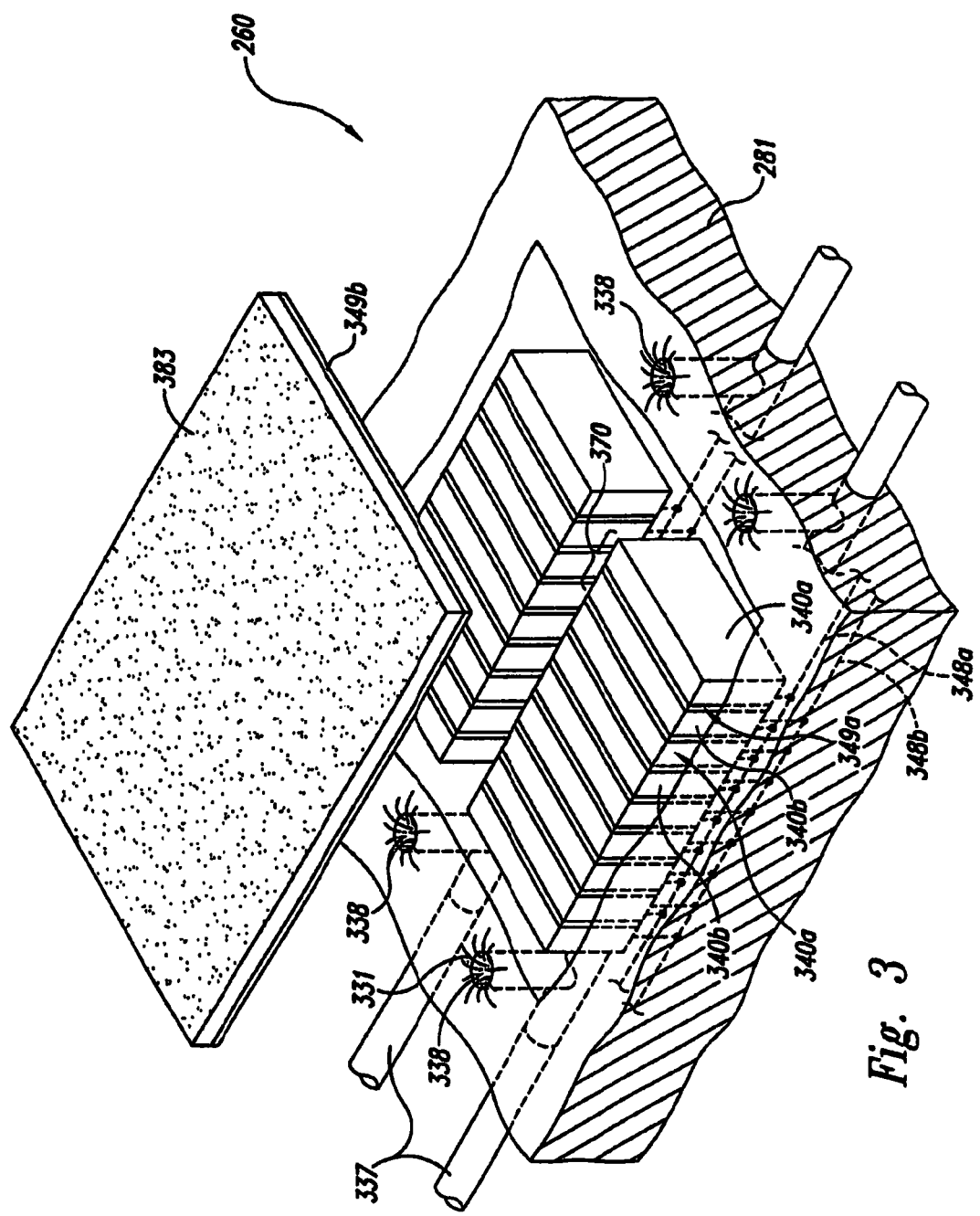
FIG. 3 is an exploded, isometric view of a portion of the polishing system shown in FIG. 2 in accordance with an embodiment of the disclosure.

FIG. 3 is a partially exploded and isometric view of one embodiment of a portion of the polishing apparatus 260 described above with reference to FIG. 2. As illustrated in FIG. 3, the top-panel 281 houses a plurality of electrode pairs 370 individually having a first electrode 340a and a second electrode 340b. The first electrodes 340a are coupled to a first lead 348a, and the second electrodes 340b are coupled to a second lead 348b. The first and second leads 348a and 348b are coupled to the current supply 221 (FIG. 2). An electrode dielectric layer 349a (e.g., Teflon™ or another suitable dielectric material) can separate the first electrodes 340a from the second electrodes 340b.

The first and second electrodes 340a and 340b can be electrically coupled to the microelectronic substrate 110 (FIG. 2) by the polishing pad 383. In one arrangement, the polishing pad 383 can be saturated with an electrolyte 331 supplied by supply conduits 337 through apertures 338 in the top-panel 281 just beneath the polishing pad 383. Accordingly, the first and second electrodes 340a and 340b are selected to be compatible with the electrolyte 331. In another arrangement, the electrolyte 331 can be supplied to the polishing pad 383 from above, for example, by disposing the electrolyte 331 in the polishing liquid 289. Accordingly, the polishing apparatus 260 (FIG. 2) can include a pad dielectric layer 349b positioned between the polishing pad 383 and the electrodes 340a and 340b. When the pad dielectric layer 349b is in place, the first and second electrodes 340a and 340b are isolated from physical contact with the electrolyte 331 and can accordingly be selected from materials that are not necessarily compatible with the electrolyte 331.

Figure 4:
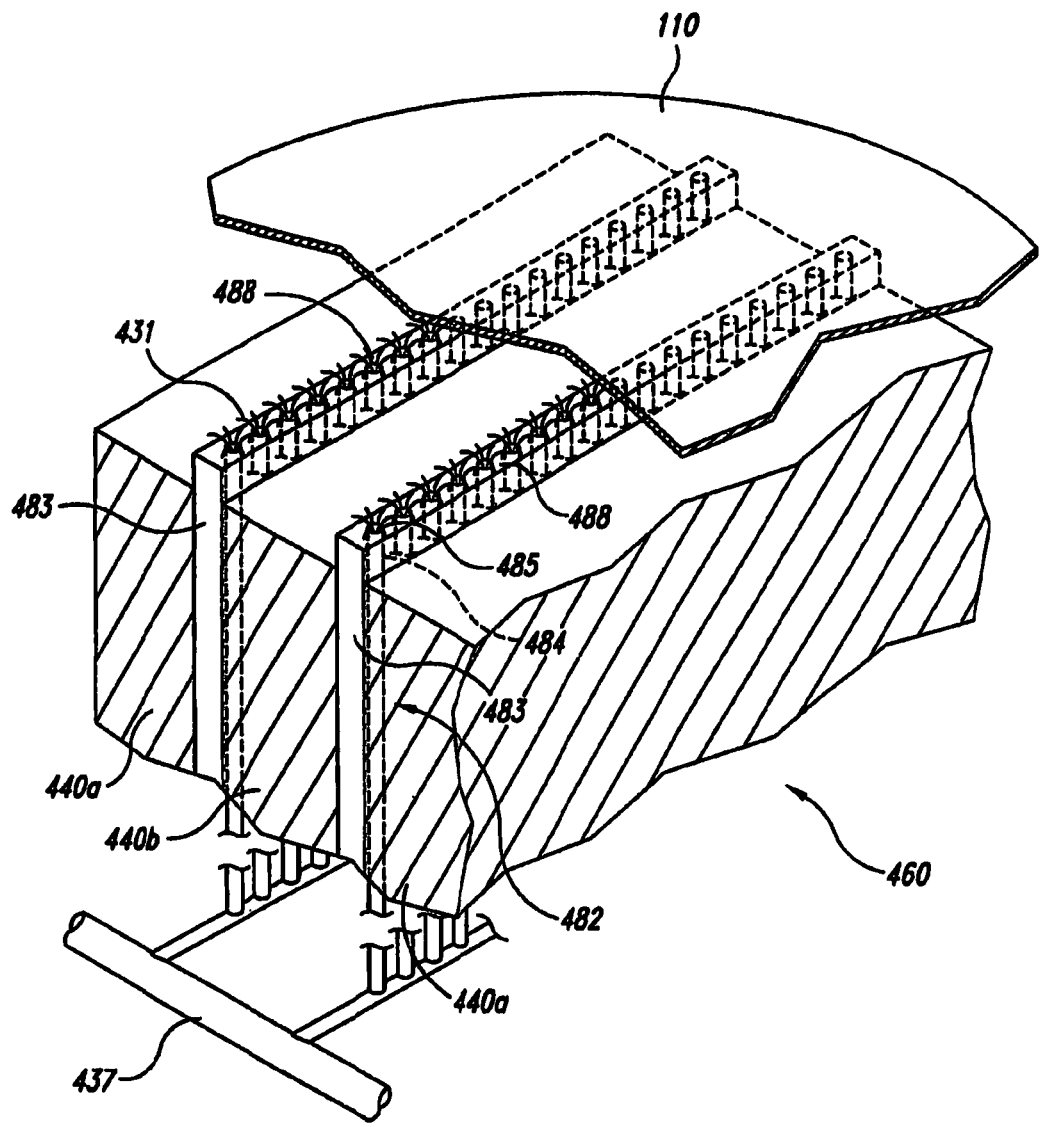
FIG. 4 is an isometric view of a portion of an apparatus for processing a microelectronic substrate in accordance with another embodiment of the disclosure.

FIG. 4 is an isometric view of a portion of an apparatus 460 having electrodes 440 (shown as a first electrode 440a and a second electrode 440b) and a polishing medium 482 arranged in accordance with another embodiment of the disclosure. The polishing medium 482 can include polishing pad portions 483 that project beyond the first and second electrodes 440a and 440b. Each polishing pad portion 483 can include a polishing surface 488 and a plurality of flow passages 484 coupled to a fluid source (not shown) with a conduit 437. Each flow passage 484 can have an aperture 485 proximate to the polishing surface 488 to provide an electrolyte 431 proximate to an interface between the microelectronic substrate 110 and the polishing surface 488. The pad portions 483 can include recesses 487 surrounding each aperture 485. Accordingly, the electrolyte 431 can proceed outwardly from the flow passages 484 while the microelectronic substrate 110 is positioned directly overhead and remains spaced apart from the electrodes 440.

Figure 5:
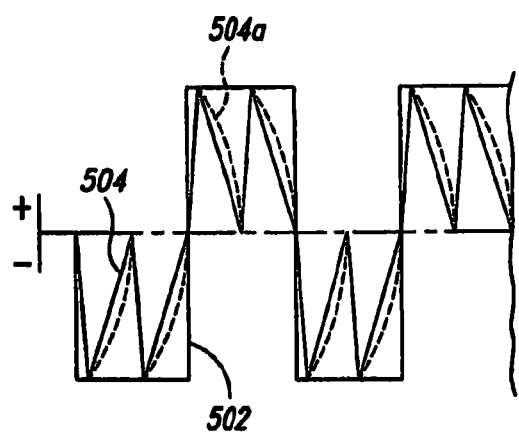
FIG. 5 schematically illustrates a waveform for processing a microelectronic substrate in accordance with another embodiment of the disclosure.

Any of the foregoing apparatuses described above with reference to FIGS. 2-4 can be used to chemically-mechanically and/or electrochemically-mechanically process the microelectronic substrate 110. When an electrochemical-mechanical process is used, the apparatuses can provide a varying electrical current that passes from the electrodes, through the conductive material of the microelectronic substrate 110, via the electrolytic fluid without contacting the electrodes with the microelectronic substrate 110. For example, as shown in FIG. 5, the apparatus can generate a high-frequency wave 504 and can superimpose a low-frequency wave 502 on the high-frequency wave 504. The high-frequency wave 504 can include series of positive or negative voltage spikes within a square wave envelope of the low-frequency wave 502. Each spike of the high-frequency wave 504 can have a relatively steep rise-time slope to transfer charge through the dielectric material to the electrolyte and a more gradual fall-time slope. The fall-time slope can define a straight line, as indicated by high-frequency wave 504, or a curved line, as indicated by high-frequency wave 504a. In other embodiments, the high-frequency wave 504 and the low-frequency wave 502 can have other shapes depending, for example, on the particular characteristics of the dielectric material and the electrolyte, the characteristics of the microelectronic substrate 110, and/or the target rate at which conductive material is to be removed from the microelectronic substrate 110.

Several experiments were conducted to determine the effects of fill material on CMP conductive material containing platinum, platinum alloys, and/or other noble metals. FIGS. 6A-D are micrograph cross-sectional views of the semiconductor substrate having an aperture 612 after being polished utilizing various fill materials. In the experiments, a fill material was first deposited onto a semiconductor substrate with apertures generally similar to those shown in FIG. 1A. A platinum layer was subsequently deposited onto the semiconductor substrate. The semiconductor substrate with the platinum layer was then chemical-mechanically polished with various slurries, down force, and polishing time. Some of the operating conditions and results from these experiments are summarized below. As can be seen from the results summarized below, a fill material containing titanium nitride was observed to be surprisingly effective in preventing platinum smearing in the containers while other fill materials in the study generally yielded significant platinum smearing. Even though the experiments were directed to remove conductive layers containing platinum using titanium nitride as the fill material, it is believed that similar experiments directed to removing other noble metals (e.g., gold, silver, tantalum, palladium, and rhodium) with a fill material containing titanium, titanium oxide, tungsten, nickel, and molybdenum would yield similar results.

Figure 6A:
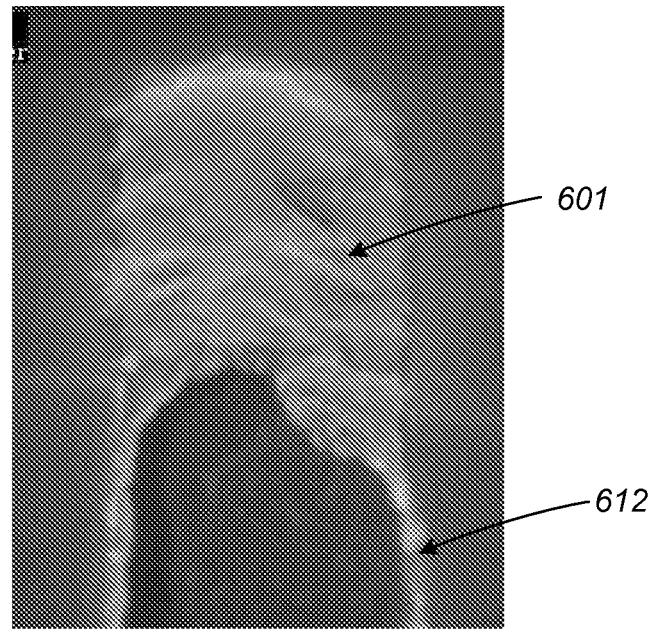
FIGS. 6A-D are micrograph cross-sectional views of a microelectronic substrate polished utilizing various fill materials in accordance with embodiments of the disclosure.

In a first experiment, a resist fill material was spun on the semiconductor substrate and had a thickness of about 17,000 angstroms. In a first run, the semiconductor substrate was first polished with a slurry having silica abrasives and a down force of 1.0 PSI for 67 seconds. The semiconductor substrate was subsequently polished with another slurry having 0.6 micron alumina abrasives and a down force of 0.8 PSI for 300 seconds. In a second run, the first polishing step was omitted, and the semiconductor substrate was polished with a slurry having 0.6 micron alumina abrasives and a down force of 0.8 PSI for 300 seconds. As shown in FIG. 6A, the polishing step smeared a significant amount of platinum 601 into the aperture 612. An Energy dispersive X-ray spectroscopy (EDX) analysis also showed significant platinum smearing in the containers for both runs.

Figure 6B:
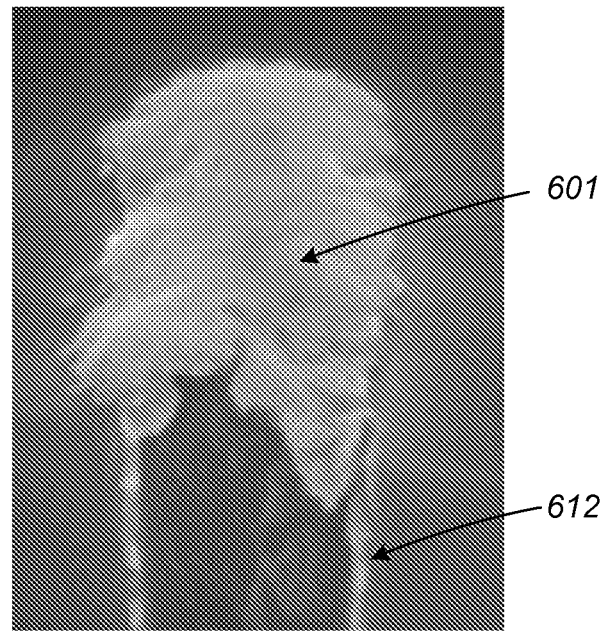

In a second experiment, an OPTL fill material was deposited onto the semiconductor substrate using CVD at 450° C. and had a thickness of about 4,500 angstroms. The semiconductor substrate was first polished with a slurry having silica abrasives and a down force of 2.5 PSI for 180 seconds. The semiconductor substrate was subsequently polished with another slurry having 0.6 micron alumina abrasives and a down force of 0.8 PSI for 300 seconds. As shown in FIG. 6B, the polishing step smeared a significant amount of platinum 601 into the aperture 612. An EDX analysis showed significant platinum smearing in the containers.

Figure 6C:
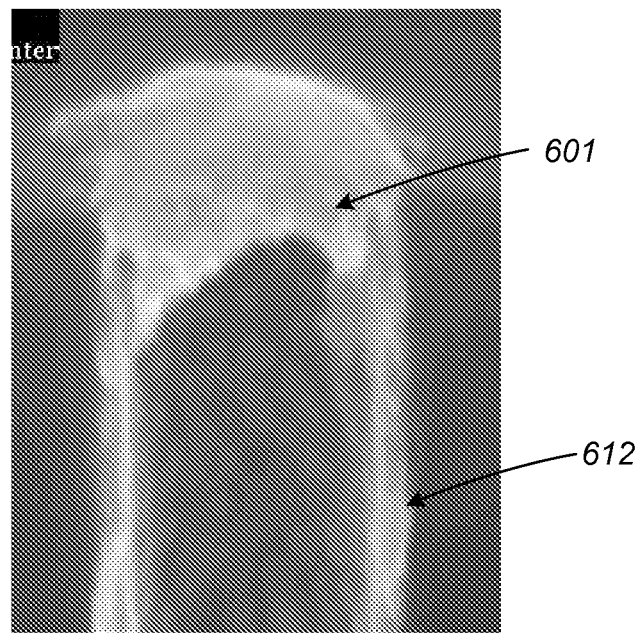

In a third experiment, a hydrogen silsesquioxane (HSQ) fill material was deposited onto the semiconductor substrate using CVD at 450° C. and had a thickness of about 6,700 angstroms. In a first run, the semiconductor substrate was first polished with a slurry having silica abrasives and a down force of 2.5 PSI for 120 seconds. The semiconductor substrate was subsequently polished with another slurry having 0.6 micron alumina abrasives and a down force of 0.8 PSI for 300 seconds. In a second run, the semiconductor substrate was first polished with a slurry having silica abrasives and a down force of 2.5 PSI for 92 seconds. The semiconductor substrate was subsequently polished with a slurry having 0.6 micron alumina abrasives and a down force of 0.8 PSI for 300 seconds. As shown in FIG. 6C, the polishing step smeared a significant amount of platinum 601 into the aperture 612. An EDX analysis showed significant platinum smearing in the containers for both runs.

Figure 6D:
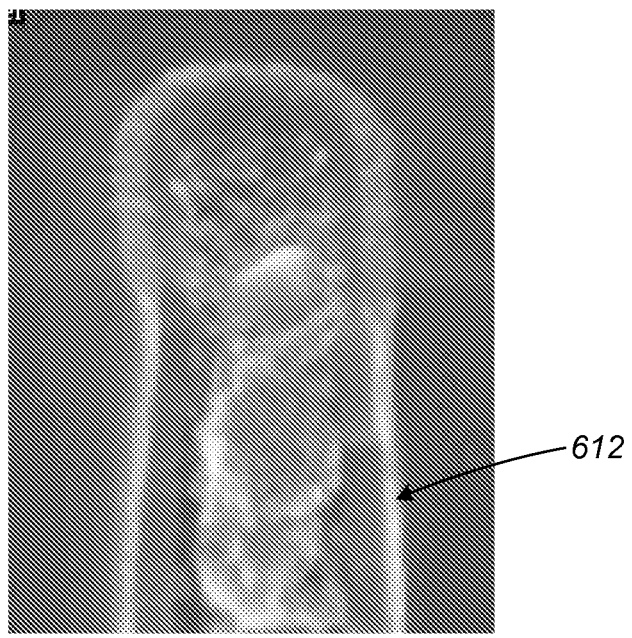

In a fourth experiment, a TiN fill material was deposited onto the semiconductor substrate using CVD at 450° C. in a first run, the TiN fill material had a thickness of about 250 angstroms. The semiconductor substrate was first polished with a slurry having silica abrasives and a down force of 1.0 PSI for 60 seconds. The semiconductor substrate was subsequently polished with another slurry having 0.6 micron alumina abrasives and a down force of 0.8 PSI for 155 seconds. In a second run, the TiN fill material had a thickness of about 250 angstroms. The semiconductor substrate was polished with a slurry having silica abrasives and a down force of 0.5 PSI for 41 seconds. The semiconductor substrate was subsequently polished with a slurry having 0.6 micron alumina abrasives and a down force of 0.8 PSI for 79.7 seconds. In a third run, the TiN fill material had a thickness of about 100 angstroms. The semiconductor substrate was polished with a slurry having silica abrasives and a down force of 0.5 PSI for 76.6 seconds. The semiconductor substrate was subsequently polished with a slurry having 0.6 micron alumina abrasives and a down force of 0.8 PSI for 120 seconds. In a fourth run, the TiN fill material had a thickness of about 100 angstroms. The semiconductor substrate was polished with a slurry having 0.6 micron alumina abrasives and a down force of 0.8 PSI for 175 seconds. As shown in FIG. 6D, the polishing step did not smear any platinum into the aperture 612. An EDX analysis showed no platinum smearing in the containers for all of these runs.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A method for forming microelectronic structures, comprising:
    forming an aperture in a substrate material;
    disposing a conductive material on the substrate material, the conductive material having a first conductive portion in the aperture and a second conductive portion external of the aperture;
    disposing a fill material on the conductive material, the fill material including a material selected from the group consisting of titanium, titanium nitride, and titanium oxide, wherein the fill material has
        a first fill portion in the aperture and proximate to the first conductive portion, wherein the first fill portion extends partially into the aperture to form a tapered end, and wherein at least a portion of the first fill portion spans a width of the aperture, and
        a second fill portion external of the aperture and on the second conductive portion; and
    forming an electrical feature in the aperture.

2. The method of claim 1 wherein the conductive material includes platinum, and wherein disposing the fill material includes disposing the fill material in the aperture without completely filling the aperture, wherein the first fill portion extends into the aperture for a distance of at least about 1000 angstroms, and the second fill portion has a thickness of about 100 angstroms to about 250 angstroms.

3. The method of claim 1 wherein the conductive material includes platinum.

4. The method of claim 1 wherein the conductive material includes platinum, and wherein:
    forming the aperture includes forming the aperture into the substrate material from a substrate material plane; and
    disposing the fill material includes disposing the fill material such that the first fill portion is substantially flush with the substrate material plane.

5. The method of claim 1 wherein the fill material has a hardness greater than about 30 GPa.

6. The method of claim 1 wherein the fill material has an internal strain that compresses the conductive material.

7. A method for forming microelectronic structures, comprising:
    forming an aperture in a substrate material;
    disposing a conductive material on the substrate material and in the aperture;
    disposing a fill material on the conductive material without completely filling the aperture, wherein a portion of the fill material extends partially into the aperture to form a tapered end, and wherein at least a portion of the fill material spans a width of the aperture, and
    polishing the substrate material to remove at least a portion of the conductive material and the fill material external to the aperture, wherein the fill material at least substantially prevents the conductive material from smearing into the aperture during polishing the substrate material.

8. The method of claim 7 wherein the conductive material includes platinum, and wherein the fill material is selected to prevent smearing the conductive material into the aperture during polishing the substrate material.

9. The method of claim 7 wherein the conductive material includes platinum, and wherein polishing the substrate material includes removing at least a portion of the conductive material and the fill material external to the aperture in one chemical-mechanical polishing procedure.

10. The method of claim 7 wherein the conductive material includes platinum, and wherein polishing the substrate material includes compressing the conductive material with the fill material while polishing the substrate material.

11. The method of claim 7 wherein polishing the substrate material includes preventing the conductive material from spreading into the aperture.

12. The method of claim 7, further comprising removing the fill material from the aperture using a wet etch procedure.

13. The method of claim 7, further comprising:
    removing the fill material from the aperture using a wet etch procedure; and
    forming a capacitor in the aperture after removing the fill material from the aperture.

14. The method of claim 7, further comprising removing a portion of the conductive material and a portion of the fill material external to the aperture in a single polishing operation.

15. The method of claim 7, further comprising removing a portion of the conductive material and a portion of the fill material external to the aperture without etching.

* * * * *